US008867298B2

(12) United States Patent  
Park

(10) Patent No.: US 8,867,298 B2  
(45) Date of Patent: Oct. 21, 2014

(54) SEMICONDUCTOR DEVICE AND OPERATING METHOD THEREOF

(75) Inventor: Seong Je Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 204 days.

(21) Appl. No.: 13/456,965

(22) Filed: Apr. 26, 2012

(65) Prior Publication Data

US 2012/0275257 A1 Nov. 1, 2012

(30) Foreign Application Priority Data

Apr. 26, 2011 (KR) .......................... 10-2011-0038983

(51) Int. Cl.
*G11C 8/00* (2006.01)
*G11C 8/12* (2006.01)
*G11C 8/06* (2006.01)
*G11C 7/10* (2006.01)
*G11C 16/04* (2006.01)

(52) U.S. Cl.
CPC .. *G11C 8/12* (2013.01); *G11C 8/06* (2013.01); *G11C 16/0483* (2013.01); *G11C 7/1051* (2013.01)
USPC ............ 365/230.03; 365/185.17; 365/189.05; 365/230.08

(58) Field of Classification Search
CPC .......... G11C 8/12; G11C 8/06; G11C 7/1051; G11C 16/0483
USPC .............. 365/230.03, 230.08, 189.05, 185.17
See application file for complete search history.

(56) References Cited

U.S. PATENT DOCUMENTS

| 7,184,307 | B2 * | 2/2007 | Lee ........................... 365/185.13 |
| 7,433,240 | B2 * | 10/2008 | Kim .......................... 365/185.23 |
| 7,663,924 | B2 * | 2/2010 | Kim et al. ................. 365/185.18 |
| 8,036,042 | B2 * | 10/2011 | Kim et al. ................. 365/185.22 |
| 8,339,825 | B2 * | 12/2012 | Park ............................ 365/49.1 |

FOREIGN PATENT DOCUMENTS

| KR | 100742278 B1 | 7/2007 |
| KR | 1020090000407 A | 1/2009 |

* cited by examiner

*Primary Examiner* — Pho M Luu
(74) *Attorney, Agent, or Firm* — William Park & Associates Patent Ltd.

(57) ABSTRACT

A semiconductor device includes a first bit line section coupled to a first cell string, a second bit line section coupled to a second cell string, a page buffer coupled to the first bit line section and a switching circuit formed between the first bit line section and the second bit line section, wherein the switching circuit couples the first bit line section to second bit line section in response to a select signal.

20 Claims, 5 Drawing Sheets

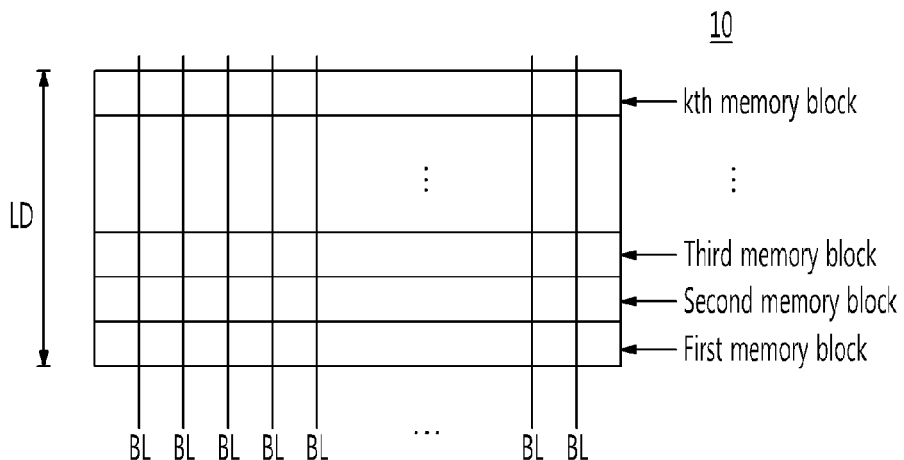
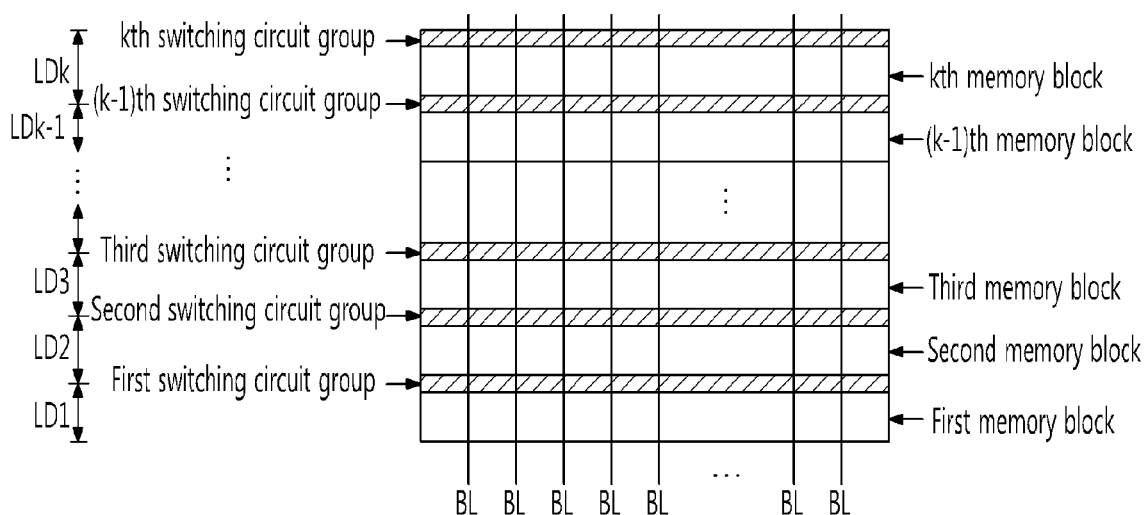

US 8,867,298 B2

SEMICONDUCTOR DEVICE AND OPERATING METHOD THEREOF

CROSS-REFERENCE TO RELATED APPLICATION

Priority is claimed to Korean patent application number 10-2011-0038983 filed on Apr. 26, 2011, the entire disclosure of which is incorporated herein by reference in its entirety.

BACKGROUND

Exemplary embodiments relate generally to a semiconductor device and an operating method thereof and more particularly to reducing a load of bit lines when the semiconductor device is operated.

A semiconductor device includes a plurality of memory blocks in which data can be stored. The plurality of memory blocks form a plane, and a memory cell array of the semiconductor memory device may consist of a single plane or multiple planes. The memory cell array consisting of the single plane is called a single plane type, and the memory cell array consisting of the multiple planes is called a multi-plane type. With the growing demands for high-capacity memory devices, the multi-plane type is being applied to many memory devices. The planes have the same configuration, and thus one of the planes is described in detail below.

FIG. 1 is a diagram illustrating a known memory cell array.

Referring to FIG. 1, a plane 10 includes a plurality of memory blocks (e.g., first to $k^{th}$ memory blocks). Each of the first to $k^{th}$ memory blocks includes a plurality of cell strings (not shown) coupled between bit lines BL and a common source line. The cell strings have the same configuration, and thus one of the cell strings is described in detail below. The cell string includes a drain select transistor, memory cells, and a source select transistor which are coupled in series. The drain select transistor is coupled to the bit line BL, and the source select transistor is coupled to the common source line.

Each bit line BL shares different memory blocks. More specifically, the first cell string of the first memory block, the first cell string of the second memory block, the first cell string of the third memory block and the first cell string of the $k^{th}$ memory block are coupled to a common bit line. That is, cell strings, included in different memory blocks but having the same order, are coupled to the common bit lines BL. For this reason, the bit lines BL are extended so as to be coupled to the first to $k^{th}$ memory blocks. Accordingly, when any selected memory block is operated, there also exists a load LD of the bit lines related to the remaining unselected memory blocks other than the selected memory block. The program operation of the first memory block is described below as an example.

A program permission voltage having a ground voltage level is supplied to bit lines selected from among the bit lines coupled to the first memory block, and a program inhibition voltage having a power source voltage level is supplied to the remaining unselected bit lines. Here, the voltages of the unselected bit lines shared by the first to $k^{th}$ memory blocks must be raised to the program inhibition voltage. Therefore, a load LD corresponding to the total length of the bit lines shared by the first to $k^{th}$ memory blocks may cause difficulties in raising the voltages of the unselected bit lines to the program inhibition voltage. That is, as the load LD of the bit lines increases, current consumption may increase when the bit lines are precharged, the time taken to raise the voltages of the bit lines to a target level may increase, and the time taken to lower the voltages of the bit lines to a target level when the bit lines are discharged may also increase. Furthermore, in a read or verify operation, reliability of read data may be deteriorated because it becomes difficult to precisely detect the voltages of the bit line according to an increase of the load LD of the bit lines.

BRIEF SUMMARY

Exemplary embodiments relate to reducing a load of bit lines by disconnects bit lines, shared by memory blocks, between the memory blocks.

A semiconductor device according to an embodiment of the present invention includes a first bit line section coupled to a first cell string; a second bit line section coupled to a second cell string; a page buffer coupled to the first bit line section; and a switching circuit formed between the first bit line section and the second bit line section, wherein the switching circuit couples the first bit line section to second bit line section in response to a select signal.

A semiconductor device according to another embodiment of the present invention includes first and second planes configured to include a plurality of memory blocks which are disposed in a line and which are each configured to include a plurality of cell strings coupled to respective bit lines, a plurality of switching circuits each coupled between the bit lines on the same line between the adjacent memory blocks, a page buffer group coupled to the bit lines of first memory blocks of the plurality of memory blocks of the first and the second planes, and a switching controller configured to control the plurality of switching circuits in order to couple the bit lines of a memory block, selected from among the plurality of memory blocks of the first plane, and the bit lines of a memory block, selected from among the plurality of memory blocks of the second plane, to the page buffer group in a program, read, or erase operation.

An operating method of a semiconductor device according to an embodiment of the present invention includes selecting one of a plurality of memory blocks, disposed in a line, in response to a command signal and an address, coupling all the bit lines coupled to memory blocks between the selected memory block and a page buffer group, from among the plurality of memory blocks, to the page buffer group and disconnecting bit lines coupled to the remaining memory blocks, and performing a program, read, or erase operation for the selected memory block.

BRIEF DESCRIPTION OF THE DRAWINGS

FIG. 1 is a diagram illustrating problems of a known memory cell array;

FIG. 2 is a diagram illustrating a concept of a memory cell array according to an embodiment of the present invention;

DESCRIPTION OF EMBODIMENTS

Figure 3:
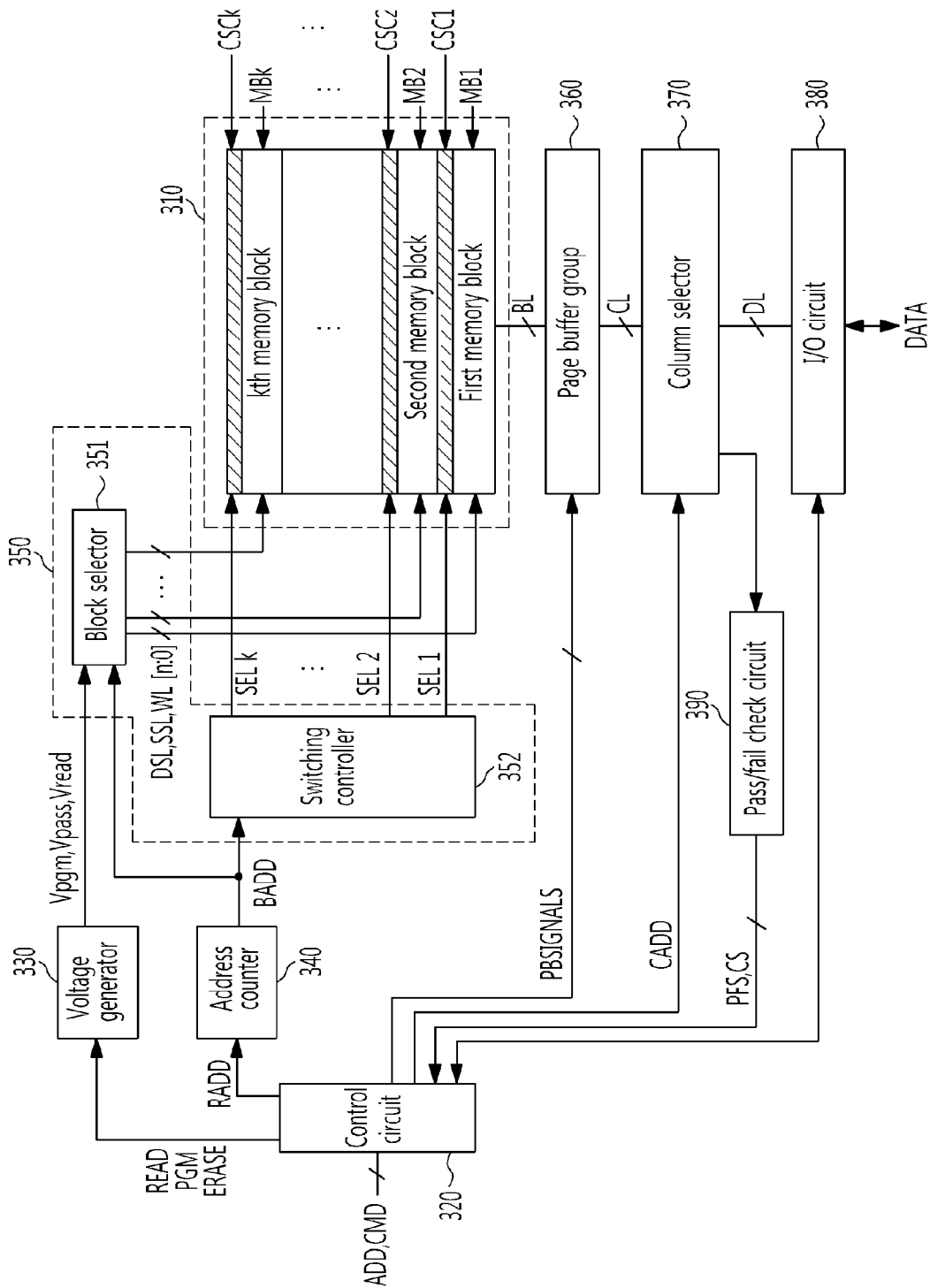
FIG. 3 is a block diagram of a semiconductor device according to an embodiment of the present invention.

Hereinafter, some exemplary embodiments of the present disclosure will be described in detail with reference to the accompanying drawings. The figures are provided to allow those having ordinary skill in the art to understand the scope of the embodiments of the disclosure.

FIG. 2 is a diagram illustrating a concept of a memory cell array according to an embodiment of the present invention.

Referring to FIG. 2, a plane 200 includes a plurality of memory blocks (e.g., first to $k^{th}$ memory blocks) and a plurality of switching circuits (e.g., first to $k^{th}$ switching circuits) disposed between the memory blocks.

The first to $k^{th}$ memory blocks share bit lines BL. Each bit line is divided into a plurality of sections. Each switching circuit included in the first to $k^{th}$ switching circuit groups is coupled between two different sections of the bit line. Here, the switching circuit can connect or disconnect the two different sections of the bit line.

The operations of the first to $k^{th}$ switching circuit groups are described in more detail below.

If the first memory block is selected, the first switching circuit is deactivated. When the first switching circuit is deactivated, voltage supplied to the bit lines BL is transferred up to the first memory block. Here, remaining switching circuits, e.g., the second to $k^{th}$ switching circuits may be activated or deactivated, but if the remaining switching circuits are deactivated, leakage current from the bit lines BL may be minimized. Assuming that a total load (LD1+LD2+LD3+ . . . +LDk) of all the bit lines BL included in the plane 200 is 1 and each bit line BL has the same load as each other (i.e., assuming that each of the loads LD1,LD2, LD3, . . . , LDk is 1/k), when the first memory block is selected and the first switching circuit is deactivated, a load of the bit lines BL is reduced to 1/k corresponding to the load 'LD1' (i.e., 1/k of the total load (LD1+LD2+LD3+ . . . +LDk)) because the length of a bit line to which voltage is applied is shortened. Accordingly, the time taken to raise (e.g., precharge) the voltages of the bit lines BL to a target level can be reduced, and an increase of a peak current can be minimized. Furthermore, the time taken to lower (e.g., discharge) the voltages of the bit lines BL can be reduced.

If the second memory block is selected, the first switching circuit is activated and the second switching circuit is deactivated. When the first switching circuit is activated and the second switching circuit is deactivated, voltage supplied to the bit lines BL is transferred to the second memory block via the first memory block. Here, remaining switching circuits, e.g., the third to $k^{th}$ switching circuits may be activated or deactivated, but if the remaining switching circuits are deactivated, leakage current from the bit lines BL may be minimized. Assuming that a total load (LD1+LD2+LD3+ . . . +LDk) of all the bit lines BL included in the plane 200 is 1 and each bit line BL has the same load as each other (i.e., assuming that each of the loads LD1,LD2, LD3, . . . , LDk is 1/k), if the second memory block is selected, a load of the bit lines BL is reduced to 2/k corresponding to the load 'LD1+LD2' (i.e., 2/k of the total load (LD1+LD2+LD3+ . . . +LDk)). Accordingly, the time taken to raise the voltages of the bit lines BL to a target level can be reduced, and an increase of a peak current can be minimized. Furthermore, the time taken to lower the voltages of the bit lines BL can be reduced.

If the third memory block is selected, the first and the second switching circuits are activated and the third switching circuit is deactivated. When the first and the second switching circuits are activated and the third switching circuit is deactivated, voltage supplied to the bit lines BL is transferred up to the third memory block via the first and the second memory blocks. Here, remaining switching circuits, e.g., the fourth to $k^{th}$ switching circuits may be activated or deactivated, but if the remaining switching circuits are deactivated, leakage current from the bit lines BL may be minimized. Assuming that a total load (LD1+LD2+LD3+ . . . +LDk) of all the bit lines BL included in the plane 200 is 1 and each bit line BL has the same load as each other (i.e., assuming that each of the loads LD1,LD2, LD3, . . . , LDk is 1/k), if the third memory block is selected, a load of the bit lines BL is reduced to 3/k corresponding to the load 'LD1+LD2+LD3' (i.e., 3/k of the total load (LD1+LD2+LD3+ . . . +LDk)). Accordingly, the time taken to raise the voltages of the bit lines BL to a target level can be reduced, and an increase of a peak current can be minimized. Furthermore, the time taken to lower the voltages of the bit lines BL can be reduced.

If the $k^{th}$ memory block is selected, the first to $(k-1)^{th}$ switching circuits are activated and the $k^{th}$ switching circuit is deactivated. When the first to $(k-1)^{th}$ switching circuits are activated and the $k^{th}$ switching circuit is deactivated, voltage supplied to the bit lines BL is transferred up to the $k^{th}$ memory block via the first to $(k-1)^{th}$ memory blocks. If the $k^{th}$ memory block is the last memory block of the memory blocks included in the plane 200 (i.e., a memory block farthest from a page buffer (not shown) for supplying the voltage to the bit lines BL), a load (LD1+LD2+LD3+ . . . +LDk) of the bit lines BL becomes 1.

As described above, since a load of the bit lines BL can be reduced according to a selected memory block, the time taken to precharge or discharge the bit lines BL can be reduced, and a peak current can be reduced.

In some exemplary embodiments of the present invention, the concept described above may be applied to a semiconductor device.

FIG. 3 is a block diagram of a semiconductor device according to an embodiment of the present invention.

There is shown the semiconductor device of a single plane type in FIG. 3. More specifically, the semiconductor device includes a memory cell array 310, a circuit group (330, 340, 350, 360, 370, 380 and 390) configured to control the program operation or the read operation of memory cells included in the memory cell array 310, and a control circuit 320 configured to control the circuit group (330, 340, 350, 360, 370, 380 and 390). The semiconductor device may be a single plane type.

In case of a NAND flash memory device, the circuit group includes a voltage generator 330, an address counter 340, a row decoder 350, a page buffer group 360, a column selector 370, an I/O circuit 380 and a pass/fail check circuit 390.

In case of the single plane type, the memory cell array 310 has a single plane. The plane includes a plurality of first to $k^{th}$ memory blocks MB1 to MBk and first to $k^{th}$ switching circuit groups CSC1 to CSCk. More specifically, each of the first to $k^{th}$ switching circuit groups CSC1 to CSCk is disposed between the first to $k^{th}$ memory blocks MB1 to MBk. The first to $k^{th}$ switching circuit groups CSC1 to CSCk disconnect or connect bit lines BL shared by the first to $k^{th}$ memory blocks MB1 to MBk in response to respective select signals SEL1 to SELk.

The memory cell array 310 is described in detail below.

Figure 4:
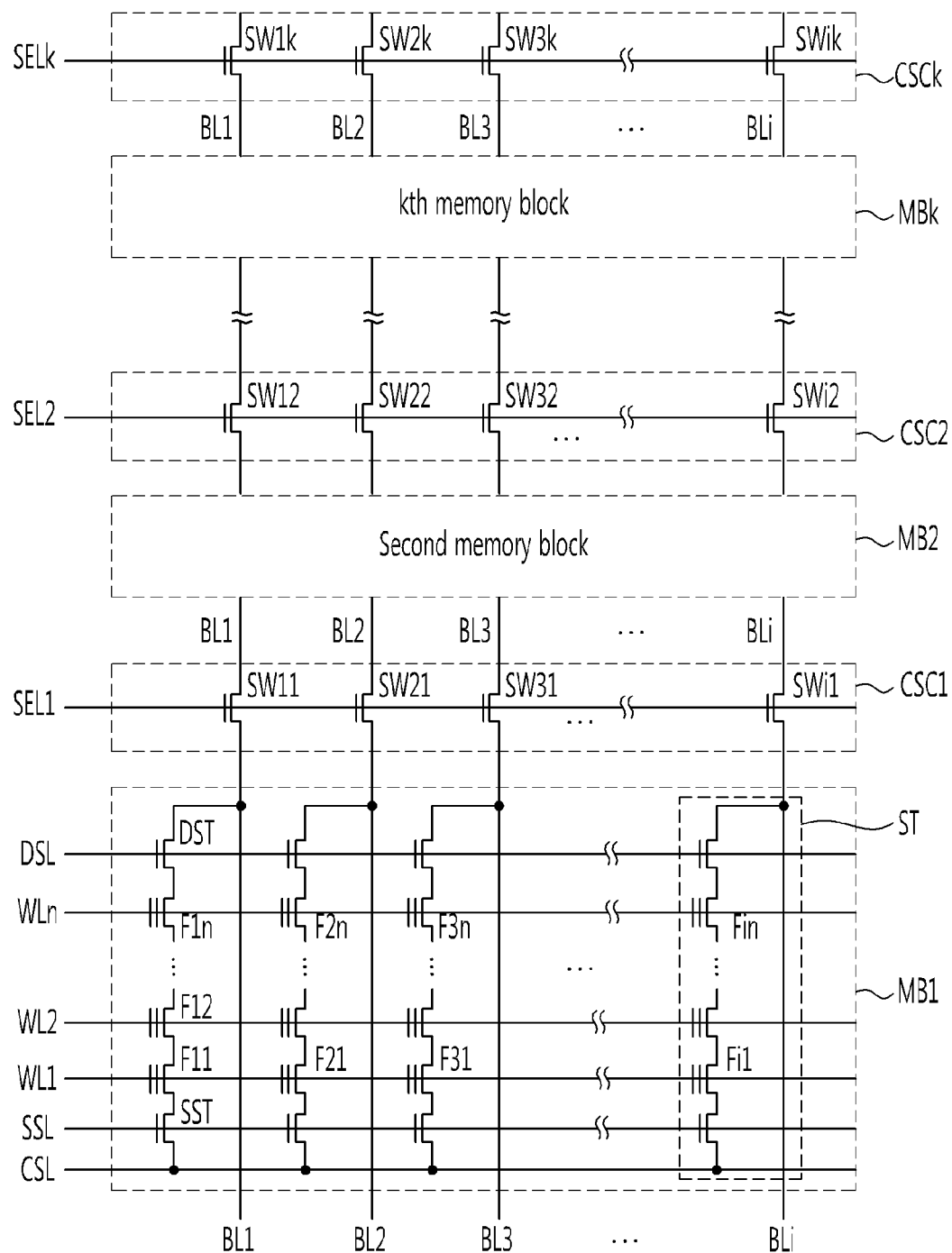
FIG. 4 is a detailed circuit diagram of a memory cell array of FIG. 3.

FIG. 4 is a detailed circuit diagram of the memory cell array 310 of FIG. 3.

Referring to FIG. 4, the memory cell array 310 includes the first memory block MB1, the first switching circuit group CSC1, the second memory block MB2, the second switching circuit group CSC2, . . . , the $k^{th}$ memory block MBk, and the $k^{th}$ switching circuit group CSCk which are sequentially disposed from the side of the page buffer group 360.

The first to $k^{th}$ switching circuit groups CSC1 to CSCk are operated in response to the first to $k^{th}$ select signals SEL1 to SELk, respectively. For example, when the first select signal SEL1 of a high level is applied to the first switching circuit group CSC1, the first switching circuit group CSC1 is activated, and thus the bit lines BL between the first memory block MB1 and the second memory block MB2 is coupled. On the other hand, when the first select signal SEL1 of a low level is applied to the first switching circuit group CSC1, the first switching circuit group CSC1 is deactivated, and thus the bit lines BL between the first memory block MB1 and the second memory block MB2 are disconnected. Accordingly, when the first select signal SEL1 of a high level is applied to the first switching circuit group CSC1 and the second select signal SEL2 of a low level is applied to the second switching circuit group CSC2, the bit lines BL are coupled to, for example, only the first memory block MB1 and the second memory block MB2.

The memory block and the switching circuit are described in more detail below.

Only the first memory block MB1 is described below for simplicity because the first to $k^{th}$ memory blocks MB1 to MBk may have the same configuration.

The first memory block MB1 includes a plurality of cell strings ST coupled between bit lines BL1 to BLi and a common source line CSL. Only one cell string ST is described as an example because the cell strings ST may have the same configuration. The cell string ST includes a drain select transistor DST, a plurality of memory cells F11 to Fin and a source select transistor SST which are coupled in series. The drain of the drain select transistor DST is coupled to the bit line BL1, and the source of the source select transistor SST is coupled to the common source line CSL. The gates of the drain select transistors DST included in different cell strings are coupled in common to a drain select line DSL, the gates of the memory cells F11 to Fi1 to F1n to Fin included in different cell strings are coupled to first to $n^{th}$ word lines WLn, respectively, and the gates of the source select transistors SST included in different cell strings are coupled in common to a source select line SSL.

Only the first switching circuit group CSC1 is described below as an example because the first to $k^{th}$ switching circuit groups CSC1 to CSCk may have the same configuration. The first switching circuit group CSC1 includes switching circuits SW11 to SWi1 for connecting or disconnecting the bit lines BL1 to BLi between the first memory block MB1 and the second memory block MB2 in response to the first select signal SEL1. Each of the switching circuits SW11 to SWi1 is formed of an NMOS transistor. When the first select signal SEL1 of a high level is received, the first switching circuit group CSC1 is activated, and thus the bit lines BL1 to BLi between the first memory block MB1 and the second memory block MB2 are coupled. On the other hand, when the first select signal SEL1 of a low level is received, the first switching circuit group CSC1 is deactivated, and thus the bit lines BL1 to BLi between the first memory block MB1 and the second memory block MB2 are disconnected. Accordingly, if the page buffer group 360 for supplying voltage to the bit lines BL1 to BLi is adjacent to the first memory block MB1, the voltage supplied to the bit lines BL1 to BLi is transferred up to only the first memory block MB1 owing to the deactivated first switching circuit group CSC1.

If the second memory block MB2 is selected, the first switching circuit group CSC1 is activated and the second switching circuit group CSC2 is deactivated. Accordingly, voltage supplied to the bit lines BL1 to BLi is transferred up to only the first and the second memory blocks MB1 and MB2. Likewise, if the $k^{th}$ memory block MBk is selected, the $k^{th}$ switching circuit group CSCk is deactivated and the first to $(k-1)^{th}$ switching circuit groups CSC1 to CSCk are activated. Accordingly, if the $k^{th}$ memory block MBk is selected, all the switching circuits SW1k to SWik of the $k^{th}$ switching circuit CSCk are turned off and the remaining switching circuits SW11 to SWi1, SW12 to SWi2, and SW1k-1 to SWik-1 are turned on.

Referring back to FIG. 3, the control circuit 320 internally generates a program operation signal PGM, a read operation signal READ and an erase operation signal ERASE in response to a command signal CMD, and also generates page buffer signals PBSIGNALS for controlling the page buffers (not shown) of the page buffer group 360 depending on a type of an operation. The control circuit 320 internally generates a row address RADD and a column address CADD in response to an address signal ADD. Furthermore, the control circuit 320 determines whether the threshold voltages of selected memory cells have risen or fallen to a target level in response to a count signal CS generated from the pass/fail check circuit 390 in a program or erase verify operation and determines whether to perform a program or erase operation again or whether the program or erase operation has been completed or failed on the basis of the result of the check.

The voltage generator 330 outputs operating voltages necessary to program, read, and erase memory cells to global lines in response to the operation signals PGM, READ and ERASE of the control circuit 320. For example, the voltage generator 330 may output the operating voltages (e.g., Vpgm, Vpass and Vread) to the global lines when memory cells are programmed.

The address counter 340 generates a block address signal BADD for selecting a memory block in response to the row address RADD of the control circuit 320.

The row decoder 350 includes a block selector 351 and a switching controller 352.

The block selector 351 transfers the operating voltages (e.g., Vpgm, Vpass and Vread) to the local lines DSL, SSL and WL[n:0] of a selected memory block in response to the block address signal BADD.

The switching controller 352 generates the first to $k^{th}$ select signals SEL1 to SELk for controlling the first to $k^{th}$ switching circuit groups CSC1 to CSCk of the memory cell array 310 in response to the block address signal BADD. That is, the first switching circuit group CSC1 is operated in response to the first select signal SEL1, the second switching circuit group CSC2 is operated in response to the second select signal SEL2, and the $k^{th}$ switching circuit group CSCk is operated in response to the $k^{th}$ select signal SELk.

For example, if the first memory block MB1 is selected, the switching controller 352 generates the first select signal SEL1 of a low level so that the first switching circuit group CSC1 is deactivated. When the first switching circuit group CSC1 is deactivated, the bit lines BL between the first memory block MB1 and the second memory block MB2 are disconnected. Accordingly, voltage supplied from the page buffer group 360 to the bit lines BL is transferred up to only the first memory block MB1. If the first memory block MB1 is selected, the bit lines BL are disconnected by the first switching circuit group CSC1, and thus remaining select signals, e.g., the second to $k^{th}$ select signals SEL2 to SELk may have any value. However, the remaining select signals, e.g., the second to $k^{th}$ select signals SEL2 to SELk may have a low level in order to reduce/minimize leakage current at the first switching circuit group CSC1.

If the second memory block MB2 is selected, the switching controller 352 generates the second select signal SEL2 of a low level so that the second switching circuit group CSC2 is deactivated. Here, since voltage supplied to the bit lines BL must be transferred up to the second memory block MB2, the switching controller 352 must generate the first select signal SEL1 of a high level when generating the second select signal SEL2 of a low level. Thus, the bit lines BL are shared by the first and the second memory blocks MB1 and MB2 because the first switching circuit CSC1 is activated and the second switching circuit group CSC2 is deactivated. Accordingly, if the second memory block MB2 is selected, the voltage supplied to the bit lines BL is supplied to the first and the second memory blocks MB1 and MB2. If the second memory block MB2 is selected, the bit lines BL are disconnected by the second switching circuit group CSC2, and thus remaining select signals, e.g., the third to $k^{th}$ select signals SEL3 to SELk may have any value. However, the remaining select signals, e.g., the third to $k^{th}$ select signals SEL3 to SELk may have a low level in order to reduce/minimize leakage current at the second switching circuit group CSC2.

If the $k^{th}$ memory block MBk is selected, the switching controller 352 generates the $k^{th}$ select signal SELk of a low level so that the $k^{th}$ switching circuit group CSCk is deactivated. Here, since voltage supplied to the bit lines BL must be transferred up to the $k^{th}$ memory block MBk, the switching controller 352 must generate the first to $(k-1)^{th}$ select signals SEL1 to SELk-1 of a high level when generating the $k^{th}$ select signal SELk of a low level. Thus, the first to $(k-1)^{th}$ switching circuit groups CSC1 to CSCk-1 are activated and the $k^{th}$ switching circuit CSCk is deactivated, the bit lines BL are shared by the first to $k^{th}$ memory blocks MB1 to MBk. Accordingly, if the $k^{th}$ memory block MBk is selected, the voltage supplied to the bit lines BL is transferred to the first to the $k^{th}$ memory blocks MB1 to MBk.

As described, if any one of the first to $k^{th}$ memory blocks MB1 to MBk of the memory cell array 310 is selected and if the selected memory block is $n^{th}$ memory block, switching circuits corresponding to memory blocks from $n^{th}$ memory block to the $k^{th}$ memory block are deactivated and switching circuits corresponding to memory blocks from the first memory block to a $(n-1)^{th}$ memory block are activated. If the switching circuit groups CSC1 to CSCk are controlled as described above, the length of the bit lines BL to which voltage is applied can be controlled depending on a selected memory block. Accordingly, a load of bit lines can be reduced when a memory block close to the page buffer group 360 is selected rather than when a memory block distant from the page buffer group 360 is selected.

The page buffer group 360 includes the page buffers (not shown) coupled to the respective bit lines BL. The page buffer group 360 precharges the bit lines BL in the program operation, the erase operation, or the read operation of the memory cells. Also, the page buffer group 360 latches data, corresponding to the threshold voltages of memory cells. Here, the data can be detected according to a shift in the voltages of the bit lines B. In the program operation, the page buffer group 360 supplies a program permission voltage (e.g., a ground voltage) or a program inhibition voltage (e.g., a power source voltage) to the bit lines BL according to data inputted to the latches. In the read operation, the page buffer group 360 detects data stored in memory cells by using the voltages of the bit lines BL varying according to the data stored in the memory cells.

The column selector 370 selects the page buffers of the page buffer group 360 in response to the column address CADD. In the read operation, data latched in a page buffer selected by the column selector 370 is outputted. Furthermore, the column selector 370 receives data from the page buffer group 360 through a column line CL and transfers the data to the pass/fail check circuit 390.

The I/O circuit 380 transfers external data DATA to the column selector 370 under the control of the control circuit 320 in a program operation so that the external data DATA is inputted to the page buffers of the page buffer group 360. When the column selector 370 sequentially transfers the external data DATA to the page buffers of the page buffer group 360, the page buffers store the external data DATA in their latches. Furthermore, in a read operation, the I/O circuit 380 externally outputs data received from the page buffers of the page buffer group 360 via the column selector 370.

The pass/fail check circuit 390 checks whether a failure has occurred in a program or erase verify operation performed after a program or erase operation and outputs a check signal PFS as the result of the check. Furthermore, the pass/fail check circuit 390 counts the number of error memory cells and generates the result of the count in the form of the count signal CS.

The semiconductor device of the single plane type has been described above. In the single plane type, if a memory block close to the page buffer group 360 is selected, a load of the bit lines BL of the memory cell array 310 can be reduced. Accordingly, a load of the bit lines BL can be reduced when the bit lines BL are precharged or discharged, and the time taken to precharge or discharge the bit lines BL can also be reduced.

Figure 5:
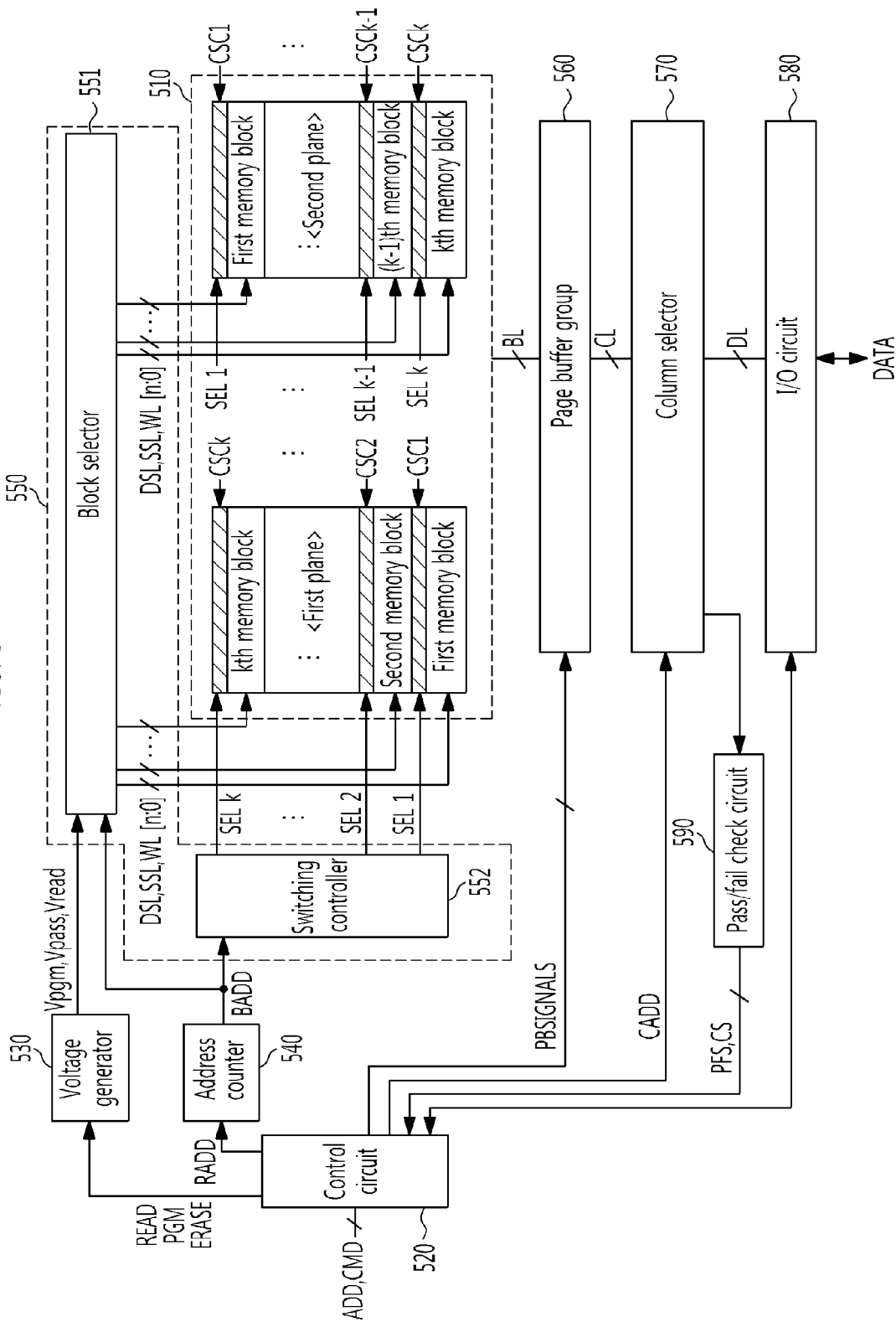
FIG. 5 is a block diagram of a semiconductor device according to an embodiment of the present invention.

FIG. 5 is a block diagram of a semiconductor device according to an embodiment of the present invention.

There is shown the semiconductor device of a multi-plane type in FIG. 5. The semiconductor device of a dual plane type including two planes includes a memory cell array 510, a circuit group (530, 540, 550, 560, 570, 580 and 590) configured to perform the program operation or the read operation of memory cells included in the memory cell array 510, and a control circuit 520 configured to control the circuit group (530, 540, 550, 560, 570, 580 and 590).

In case of a NAND flash memory device, the circuit group includes a voltage generator 530, an address counter 540, a row decoder 550, a page buffer group 560, a column selector 570, an I/O circuit 580 and a pass/fail check circuit 590.

The memory cell array 510 has the dual plane type including first and second planes. In particular, the plane of FIG. 4 may be divided into the first plane and the second plane. That is, half the cell strings of the first memory block (MB1 of FIG. 4) are included the first plane, and the remaining cell strings thereof are included in the second plane. The strings of each of the remaining memory blocks are also divided into the first plane and the second plane. Accordingly, if the first memory block is selected when the semiconductor device is operated, the first memory block of the first plane and the first memory block of the second plane are selected.

In particular, a first memory block, a first switching circuit group CSC1, a second memory block, a second switching circuit group CSC2, . . . , a $k^{th}$ memory block, and a $k^{th}$ switching circuit group CSCk are disposed in the first plane so that they are sequentially distant from the page buffer group 560. The order of the memory blocks and the switching circuits disposed in the second plane is opposite to that of the first plane. That is, a $k^{th}$ memory block, a $k^{th}$ switching circuit group CSCk, a $(k-1)^{th}$ memory block, a $(k-1)^{th}$ switching circuit group CSCk-1, . . . , a first memory block and a first switching circuit group CSC1 are sequentially disposed in the second plane so that they are distant from the page buffer group 560.

The control circuit 520 generates a program operation signal PGM, a read operation signal READ, and an erase operation signal ERASE in response to a command signal CMD and also generates page buffer signals PBSIGNALS for controlling the page buffers (not shown) of the page buffer group 560 depending on a type of an operation. The control circuit 520 outputs a row address RADD and a column address CADD in response to an address signal ADD. Furthermore, the control circuit 520 determines whether the threshold voltages of selected memory cells have risen or fallen to a target level in response to a count signal CS generated from the pass/fail check circuit 590 in a program or erase verify operation and determines whether to perform a program or erase operation again or whether the program or erase operation has been completed or failed on the basis of the result of the check.

The voltage generator 530 outputs operating voltages necessary to program, read and erase memory cells to global lines in response to the operation signals PGM, READ and ERASE of the control circuit 520. For example, the voltage generator 530 may output the operating voltages (e.g., Vpgm, Vpass and Vread) to the global lines when memory cells are programmed.

The address counter 540 generates a block address signal BADD for selecting a memory block in response to the row address RADD of the control circuit 520.

The row decoder 550 includes a block selector 551 and a switching controller 552.

The block selector 551 transfers the operating voltages (e.g., Vpgm, Vpass and Vread) to the local lines DSL, SSL and WL[n:0] of a selected memory block in response to the block address signal BADD.

The switching controller 552 generates the first to $k^{th}$ select signals SEL1 to SELk for controlling the first to $k^{th}$ switching circuit groups CSC1 to CSCk of the memory cell array 310 in response to the block address signal BADD. That is, the first switching circuit group CSC1 included in the first and the second planes are operated at the same time in response to the first select signal SEL1. The second switching circuit group CSC2 included in the first and the second planes are operated at the same time in response to the second select signal SEL2. The $k^{th}$ switching circuit group CSCk included in the first and the second planes are operated at the same time in response to the $k^{th}$ select signal SELk. In particular, if the orders of the memory blocks are opposite to each other in the first plane and the second plane as in FIG. 5, only switching circuits corresponding to selected memory blocks are deactivated, and all the remaining switching circuits are activated.

For example, if the first memory block is selected, the switching controller 552 generates the first select signal SEL1 of a low level so that the first switching circuit group CSC1 of the first and the second planes are deactivated and generates the second to $k^{th}$ select signals SEL2 to SELk of a high level so that the second to $k^{th}$ switching circuit groups CSC2 to CSCk of the first and the second planes are activated. Accordingly, voltage supplied to the bit lines BL is transferred up to the first memory block in the first plane and is transferred from the $k^{th}$ memory block to the first memory block in the second plane. Thus, a load of the bit lines BL in the second plane is a maximum, but a load of the bit lines BL in the first plane is a minimum. Consequently, a total load of the memory cell array 510 is reduced by half.

If the second memory block is selected, the switching controller 552 generates the second select signal SEL2 of a low level so that the second switching circuit group CSC2 of the first and the second planes are deactivated and generates the first select signal SEL1 of a high level and the third to $k^{th}$ select signals SEL3 to SELk of a high level so that the first switching circuit group CSC1 and the third to $k^{th}$ switching circuit groups CSC3 to CSCk of the first and the second planes are activated. Accordingly, voltage supplied to the bit lines BL is transferred up to the first and the second memory blocks in the first plane and is transferred from the $k^{th}$ memory block to the second memory block in the second plane. Thus, a load of the bit lines BL is reduced in the second plane as compared with the case where the first memory block is selected, but a load of the bit lines BL is increased in the first plane. Accordingly, a total load of the memory cell array 510 is reduced by half as in the case where the first memory block is selected.

Likewise, if the $k^{th}$ memory block is selected, a load of the bit lines BL is a maximum in the first plane, but a load of the bit lines BL is a minimum in the second plane. Accordingly, a total load of the memory cell array 510 is reduced by half. That is, a load of a memory block can be reduced irrespective of selected memory blocks.

The page buffer group 560 includes the page buffers (not shown) coupled to the respective bit lines BL. The page buffer group 560 precharges the bit lines BL in the program operation, the erase operation, or the read operation of the memory cells. Also, the page buffer group 560 latches data, corresponding to the threshold voltages of memory cells. Here, the data can be detected according to a shift in the voltages of the bit lines B. In the program operation, the page buffer group 560 supplies a program permission voltage (e.g., a ground voltage) or a program inhibition voltage (e.g., a power source voltage) to the bit lines BL according to data inputted to the latches. In the read operation, the page buffer group 560 detects data stored in memory cells by using the voltages of the bit lines BL varying according to the data stored in the memory cells.

The column selector 570 selects the page buffers of the page buffer group 560 in response to the column address CADD. In the read operation, data latched in a page buffer selected by the column selector 570 is outputted. Furthermore, the column selector 570 receives data from the page buffer group 560 through a column line CL and transfers the data to the pass/fail check circuit 590.

The I/O circuit 580 transfers external data DATA to the column selector 570 under the control of the control circuit 520 in a program operation so that the external data DATA is inputted to the page buffers of the page buffer group 560. When the column selector 570 sequentially transfers the external data DATA to the page buffers of the page buffer group 560, the page buffers store the external data DATA in their latches. Furthermore, in a read operation, the I/O circuit 580 externally outputs data received from the page buffers of the page buffer group 560 via the column selector 570.

The pass/fail check circuit 590 checks whether a failure has occurred in a program or erase verify operation performed after a program or erase operation and outputs a check signal PFS as the result of the check. Furthermore, the pass/fail check circuit 590 counts the number of error memory cells and generates the result of the count in the form of the count signal CS.

In an embodiment of the present invention, the semiconductor device of the dual plane type has been described above. In the dual plane type, if a memory block close to the page buffer group 560 is selected in the first plane, a memory block far from the page buffer group 560 is selected in the second plane. Thus, a load of the bit lines BL of the memory cell array 510 can be regularly reduced irrespective of a selected memory block. Accordingly, when the bit lines BL are precharged or discharged, a load of the bit lines BL can be reduced and the time taken to precharge or discharge the bit lines BL can also be reduced.

Figure 6:
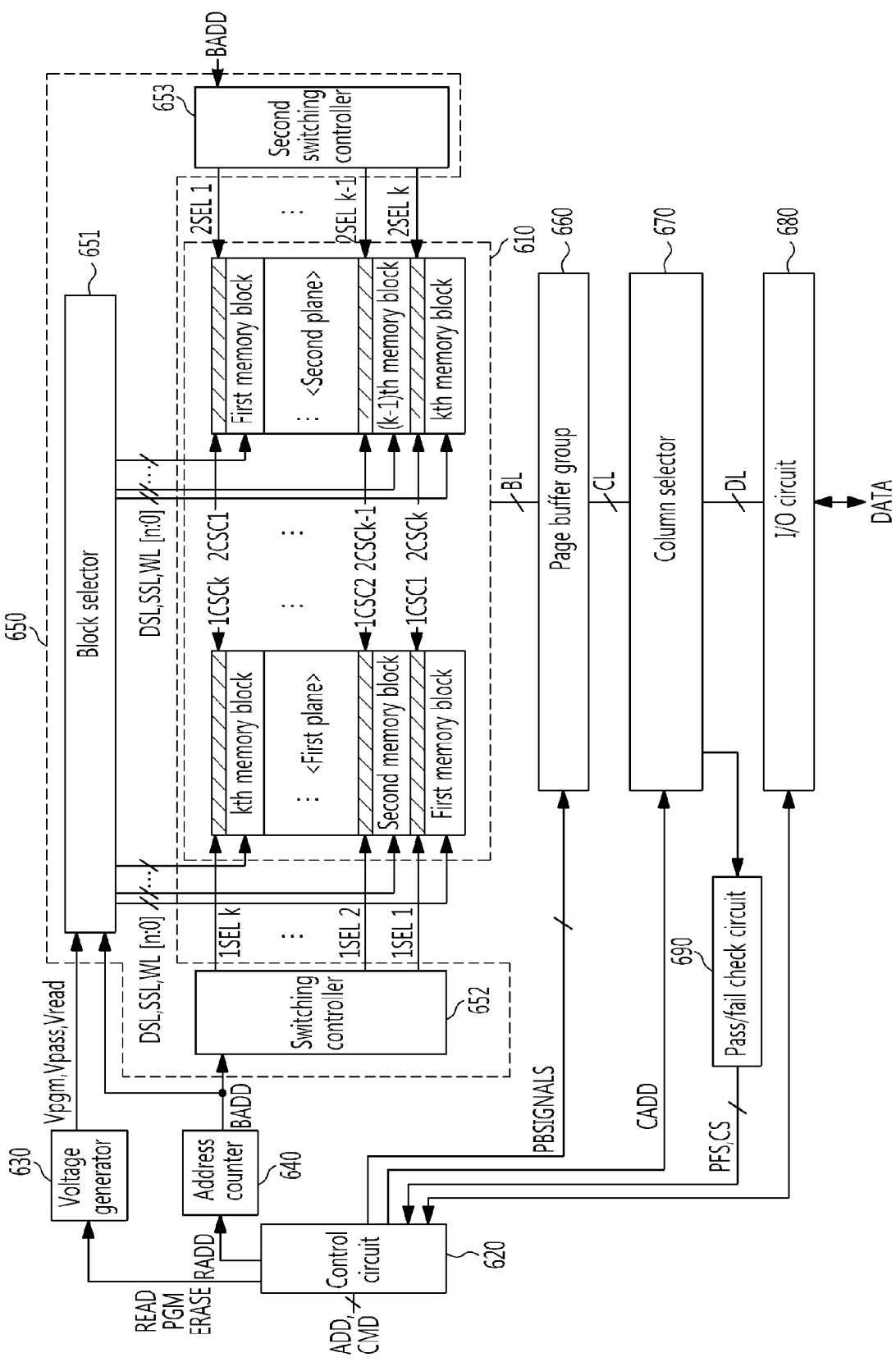
FIG. 6 is a block diagram of a semiconductor device according to yet an embodiment of the present invention.

FIG. 6 is a block diagram of a semiconductor device according to an embodiment of the present invention.

There is shown the semiconductor device of a multi-plane type in FIG. 6. The semiconductor device of a dual plane type including two planes includes a memory cell array 610, a circuit group (630, 640, 650, 660, 670, 680 and 690) configured to perform the program operation or the read operation of memory cells included in the memory cell array 610 and a control circuit 620 configured to control the circuit group (630, 640, 650, 660, 670, 680 and 690).

In case of a NAND flash memory device, the circuit group includes a voltage generator 630, an address counter 640, a row decoder 650, a page buffer group 660, a column selector 670, an I/O circuit 680 and a pass/fail check circuit 690.

The memory cell array 610 has the dual plane type including first and second planes. In particular, the plane of FIG. 4 may be divided into the first plane and the second plane. That is, half the cell strings of the first memory block (MB1 of FIG. 4) are included the first plane, and the remaining cell strings thereof are included in the second plane. The strings of each of the remaining memory blocks are also divided into the first plane and the second plane. Accordingly, if the first memory block is selected when the semiconductor device is operated, the first memory block of the first plane and the first memory block of the second plane are selected at the same time. In particular, a first memory block, a first switching circuit group 1CSC1, a second memory block, a second switching circuit group 1CSC2, . . . , a $k^{th}$ memory block, and a $k^{th}$ switching circuit group 1CSCk are disposed in the first plane so that they are sequentially distant from the page buffer group 660. The order of the memory blocks and the switching circuits disposed in the second plane is opposite to that of the first plane. That is, a $k^{th}$ memory block, a $k^{th}$ switching circuit group 2CSCk, a $(k-1)^{th}$ memory block, a $(k-1)^{th}$ switching circuit group 2CSCk-1, . . . , a first memory block, and a first switching circuit 2CSC1 are sequentially disposed in the second plane so that they are distant from the page buffer group 660.

The control circuit 620 generates a program operation signal PGM, a read operation signal READ, and an erase operation signal ERASE in response to a command signal CMD and also generates page buffer signals PBSIGNALS for controlling the page buffers (not shown) of the page buffer group 660 depending on a type of an operation. The control circuit 620 outputs a row address RADD and a column address CADD in response to an address signal ADD. Furthermore, the control circuit 620 determines whether the threshold voltages of selected memory cells have risen or fallen to a target level in response to a count signal CS generated from the pass/fail check circuit 690 in a program or erase verify operation and determines whether to perform a program or erase operation again or whether the program or erase operation has been completed or failed on the basis of the result of the check.

The voltage generator 630 outputs operating voltages necessary to program, read and erase memory cells to global lines in response to the operation signals PGM, READ and ERASE of the control circuit 620. For example, the voltage generator 630 may output the operating voltages (e.g., Vpgm, Vpass and Vread) to the global lines when memory cells are programmed.

The address counter 640 generates a block address signal BADD for selecting a memory block in response to the row address RADD of the control circuit 620.

The row decoder 650 includes a block selector 651, a first switching controller 652, and a second switching controller 653.

The block selector 651 transfers the operating voltages (e.g., Vpgm, Vpass and Vread) of the voltage generator 630 to the local lines DSL, SSL and WL[n:0] of a selected memory block in response to the block address signal BADD.

The first switching controller 652 generates first to $k^{th}$ select signals 1SEL1 to 1SELk for controlling the first to $k^{th}$ switching circuit groups 1CSC1 to 1CSCk of the first plane in response to the block address signal BADD. That is, the first switching circuit group 1CSC1 of the first plane is operated in response to the first select signal 1SEL1, the second switching circuit group 1CSC2 thereof is operated in response to the second select signal 1SEL2, and the $k^{th}$ switching circuit group 1CSCk thereof is operated in response to the $k^{th}$ select signal 1SELk. In particular, when any one memory block is selected in the first plane, the first switching controller 652 generates the select signals so that all the switching circuits from the first switching circuit group 1CSC1 to the switching circuits of memory blocks prior to the selected memory block are activated and all the switching circuits from the switching circuit of the selected memory block to the $k^{th}$ switching circuit group 1CSCk are deactivated. For example, if the second memory block is selected, the first switching controller 652 generates the first select signal 1SEL1 of a high level and the second to $k^{th}$ select signals 1SEL2 to 1SELk of a low level. If all the switching circuits from the switching circuit of a selected memory block to the $k^{th}$ switching circuit group 1CSCk are deactivated as described above, an increased of a load of the switching circuits can be minimized.

The second switching controller 653 generates $k^{th}$ to first select signals 2SELk to 2SEL1 for controlling the $k^{th}$ to first switching circuit groups 2CSCk to 2CSC1 of the second plane in response to the block address signal BADD. That is, $k^{th}$ switching circuit group 2CSCk of the second plane is operated in response to the $k^{th}$ select signal 2SELk, the $(k-1)^{th}$ switching circuit group 2CSCk-1 thereof is operated in response to the $(k-1)^{th}$ select signal 2SELk-1, and the first switching circuit group 2CSC1 thereof is operated in response to the first select signal 2SEL1. In particular, when any one memory block is selected in the second plane, the second switching controller 653 generates the select signals so that all the switching circuits from the $k^{th}$ switching circuit group 2CSCk to the switching circuits of memory blocks prior to the selected memory block are activated and all the switching circuits from the switching circuit of the selected memory block to the first switching circuit group 2CSC1 are deactivated. For example, when the $(k-1)^{th}$ memory block is selected, the second switching controller 653 generates the $k^{th}$ select signal 2SELk of a high level and the $(k-1)^{th}$ to first select signals 2SELk-1 to 2SEL1 of a low level. If all the switching circuits from the switching circuit of the selected memory block to the first switching circuit group 2CSC1 are deactivated as described above, an increase of a load of the switching circuits can be minimized.

In particular, the first switching controller 652 and the second switching controller 653 generate opposite select signals in order to reduce a load of the bit lines BL for the same memory blocks included in the first and the second planes.

For example, if the first memory blocks of the first and the second plane are selected, the first switching controller 652 generates the first to $k^{th}$ select signals 1SEL1 to 1SELk of a low level, and the second switching controller 653 generates the $k^{th}$ to second select signals 2SELk to 2SEL2 of a high level and the first select signal group 2CSC1 of a low level. If the second memory blocks of the first and the second planes are selected, the first switching controller 652 generates the first select signal 1SEL1 of a high level and the second to $k^{th}$ select signals 1SEL2 to 1SELk of a low level, and the second switching controller 653 generates the $k^{th}$ to third select signal groups 2CSCk to 2CSC3 of a high level and the second and the first select signals 2SEL2 and 2SEL1 of a low level. If the $k^{th}$ memory blocks of the first and the second plane are selected, the first switching controller 652 generates the first to $(k-1)^{th}$ select signals 1SEL1 to 1SELk-1 of a high level and the $k^{th}$ select signal 1SELk of a low level, and the second switching controller 653 generates the $k^{th}$ to first select signals 2SELk to 2SEL1 of a low level.

If the switching circuits are controlled as described above, a load of the bit lines BL is increased in the first plane, but a load of the bit lines BL is decreased in the second plane, and a load of the bit lines BL is decreased in the first plane, but a load of the bit lines BL is increased in the second plane. Accordingly, a total load of the bit lines BL of the memory cell array 610 can be decreased irrespective of selected memory blocks.

The page buffer group 660 includes the page buffers (not shown) coupled to the respective bit lines BL. The page buffer group 660 precharges the bit lines BL in the program operation, the erase operation, or the read operation of the memory cells. Also, the page buffer group 660 latches data, corresponding to the threshold voltages of memory cells. Here, the data can be detected according to a shift in the voltages of the bit lines B. In the program operation, the page buffer group 660 supplies a program permission voltage (e.g., a ground voltage) or a program inhibition voltage (e.g., a power source voltage) to the bit lines BL according to data inputted to the latches. In the read operation, the page buffer group 660 detects data stored in memory cells by using the voltages of the bit lines BL varying according to the data stored in the memory cells.

The column selector 670 selects the page buffers of the page buffer group 660 in response to the column address CADD. In the read operation, data latched in a page buffer selected by the column selector 670 is outputted. Furthermore, the column selector 670 receives data from the page buffer group 660 through a column line CL and transfers the data to the pass/fail check circuit 690.

The I/O circuit 680 transfers external data DATA to the column selector 670 under the control of the control circuit 620 in a program operation so that the external data DATA is inputted to the page buffers of the page buffer group 660. When the column selector 670 sequentially transfers the external data DATA to the page buffers of the page buffer group 660, the page buffers store the external data DATA in their latches. Furthermore, in a read operation, the I/O circuit 680 externally outputs data received from the page buffers of the page buffer group 660 via the column selector 670.

The pass/fail check circuit 690 checks whether a failure has occurred in a program or erase verify operation performed after a program or erase operation and outputs a check signal PFS as the result of the check. Furthermore, the pass/fail check circuit 690 counts the number of error memory cells and generates the result of the count in the form of the count signal CS.

In an embodiment of the present invention, the semiconductor device of the dual plane type has been described. In the dual plane type, if a memory block close to the page buffer group 660 is selected in the first plane, a memory block far from the page buffer group 660 is selected in the second plane. Thus, a load of the bit lines BL of the memory cell array 610 can be regularly reduced irrespective of selected memory blocks. Furthermore, an increase of a load due to leakage can be minimized by deactivating the switching circuits of some of unselected memory blocks when a selected memory block is operated. In particular, the time taken to precharge or discharge the bit lines BL can be reduced by reducing a load of the bit lines BL, and thus reliability of a read or verify operation can be improved.

Although the semiconductor device of the dual plane type including the two planes has been described above, the semiconductor device may include plane groups each including two or more planes (e.g., 4, 6 or 8), and the groups may be independently operated.

In accordance with an embodiment of the present invention, when the semiconductor device is operated, a load of the bit lines can be reduced. Accordingly, the time taken to precharge or discharge the bit lines can be reduced, and a peak current can be minimized. Furthermore, reliability of program, read and verify operations can be improved because a load of the bit lines is reduced.

What is claimed is:

1. A semiconductor device, comprising:
    a plurality of memory blocks disposed in a row, wherein each of the memory blocks includes a plurality of cell strings coupled to respective bit lines;
    a plurality of switching circuits each coupled to the bit lines that aredisposed between the memory blocks; and
    a page buffer group coupled to the bit lines of a first memory block among the memory blocks.

2. The semiconductor device of claim 1, wherein the switching circuits include a plurality of NMOS transistors coupled between the bit lines in the same line.

3. The semiconductor device of claim 1, further comprising:
    a switching controller configured to control the plurality of switching circuits in order to couple the bit lines of a memory block, selected from among the plurality of memory blocks, to the page buffer group in a program, read, or erase operation.

4. The semiconductor device of claim 3, further comprising:
    a voltage generator configured to generate operating voltages necessary for program, read or erase operation in response to operation signals;
    a block selector configured to transfer the operating voltages to local lines of the selected memory block;
    an address counter configured to output a block address signal to the switching controller in response to a local address;
    a column selector configured to select a page buffer;
    an I/O circuit configured to transfer external data to the column selector or output data received from the column selector; and
    a control circuit configured to control the voltage generator, the block selector, the address counter, the page buffer group, the column selector and the I/O circuit by generating the operation signals and the local address in response to command signals and an address.

5. A semiconductor device, comprising:
    first and second planes each comprises a plurality of memory blocks arranged in a column and comprising a plurality of cell strings coupled to respective bit line sections;
    a plurality of switching circuits each arranged between two adjacent bit line sections arranged in a line, wherein each of the switching circuits is arranged between two adjacent memory blocks;
    a page buffer group coupled to bit line sections of first memory blocks of the plurality of memory blocks of the first and the second planes; and
    a switching controller configured to control the plurality of switching circuits in order to couple bit line sections of a memory block, selected from among the plurality of memory blocks of the first plane, and bit line sections of a memory block, selected from among the plurality of memory blocks of the second plane, to the page buffer group in a program, read or erase operation.

6. The semiconductor device of claim 5, wherein the selected memory block of the first plane and the selected memory block of the second plane are simultaneously selected.

7. The semiconductor device of claim 5, wherein each of the switching circuits is formed of an NMOS transistor.

8. The semiconductor device of claim 5, further comprising:
peripheral circuits configured to perform the program, read or erase operation for the selected memory blocks of the first and the second planes; and
a control circuit configured to control the peripheral circuits and switching circuits of the selected memory blocks of the first and the second planes so that, when a memory block close to the page buffer group is selected in the first plane, a memory block farther from the page buffer group than the selected memory block of the first plane is selected in the second plane and, when a memory block far from the page buffer group is selected in the first plane, a memory block closer to the page buffer group than the selected memory block of the first plane is selected in the second plane.

9. The semiconductor device of claim 8, wherein the control circuit generates operation signals, a local address, a column address and page buffer control signals for controlling the peripheral circuits in response to command signals and an address.

10. The semiconductor device of claim 9, wherein the peripheral circuits comprise:
a voltage generator configured to generate operating voltages necessary for the program, read or erase operation in response to the operation signals;
an address counter configured to output a block address signal to the switching controller in response to the local address;
a block selector configured to select the plurality of memory blocks of the first and the second planes in response to the block address signal and to transfer the operating voltages to the local lines of the selected memory blocks; and
a column selector configured to select the page buffers of the page buffer group in response to the page buffer control signals.

11. The semiconductor device of claim 8, wherein the control circuit turns off all switching circuits corresponding to the selected memory blocks of the first and the second planes among the plurality of switching circuits, and turns on remaining switching circuits.

12. The semiconductor device of claim 5, wherein the switching controller comprises:
a first switching controller configured to control switching circuits of the first plane, from among the plurality of switching elements, in order to couple bit line sections of a memory block, selected from among the plurality of memory blocks of the first plane, to the page buffer group in a program, read, or erase operation; and
a second switching controller configured to control switching circuits of the second plane, from among the plurality of switching elements, in order to couple bit line sections of a memory block, selected from among the plurality of memory blocks of the second plane, to the page buffer group in the program, read, or erase operation.

13. The semiconductor device of claim 12, wherein the selected memory block of the first plane and the selected memory block of the second plane are simultaneously selected.

14. The semiconductor device of claim 12, wherein each of the switching circuits is formed of an NMOS transistor.

15. The semiconductor device of claim 12, further comprising:
peripheral circuits configured to perform the program, read, or erase operation for the selected memory blocks of the first and the second planes; and
a control circuit configured to control the peripheral circuits so that, when a memory block close to the page buffer group is selected in the first plane, a memory block farther from the page buffer group than the selected memory block of the first plane is selected in the second plane and, when a memory block far from the page buffer group is selected in the first plane, a memory block closer to the page buffer group than the selected memory block of the first plane is selected in the second plane and to control switching circuits of the selected memory blocks of the first and the second planes.

16. The semiconductor device of claim 15, wherein the control circuit generates operation signals, a local address, a column address and page buffer control signals for controlling the peripheral circuits in response to command signals and an address.

17. The semiconductor device of claim 16, wherein the peripheral circuits comprise:
a voltage generator configured to generate operating voltages necessary for the program, read or erase operation in response to the operation signals;
an address counter configured to output a block address signal to the switching controller in response to the local address;
a block selector configured to select the plurality of memory blocks of the first and the second planes in response to the block address signal and to transfer the operating voltages to the local lines of the selected memory blocks; and
a column selector configured to select the page buffers of the page buffer group in response to the page buffer control signals.

18. The semiconductor device of claim 12, wherein the first switching controller turns on all switching circuits between the selected memory block of the first plane and the page buffer group and turns off all remaining switching circuits of the first plane.

19. The semiconductor device of claim 12, wherein the second switching controller turns on all switching circuits between the selected memory block of the second plane and the page buffer group and turns off all remaining switching circuits of the second plane.

20. An operating method of a semiconductor device, comprising:
selecting a memory block among a plurality of memory blocks;
coupling bit lines coupled between a selected memory block and a page buffer group to the page buffer group, and disconnecting bit lines coupled to remaining memory blocks from the page buffer group; and
performing a program, read or erase operation for the selected memory block.

* * * * *